(12) United States Patent
Van Dijk et al.

(10) Patent No.: US 7,538,875 B2
(45) Date of Patent: May 26, 2009

(54) LITHOGRAPHIC APPARATUS AND METHODS FOR USE THEREOF

(75) Inventors: Remco Marcel Van Dijk, Eindhoven (NL); Donis George Flagello, Scottsdale, AZ (US); Michel Fransois Hubert Klaassen, Eindhoven (NL); Tammo Uitterdijk, De Bilt (NL)

(73) Assignee: ASML Netherlands B.V., Veldhoven (NL)

( * ) Notice: Subject to any disclaimer, the term of this patent is extended or adjusted under 35 U.S.C. 154(b) by 910 days.

(21) Appl. No.: 11/014,062

(22) Filed: Dec. 17, 2004

(65) Prior Publication Data

US 2005/0206879 A1    Sep. 22, 2005

Related U.S. Application Data

(60) Provisional application No. 60/530,984, filed on Dec. 22, 2003.

(51) Int. Cl.
*G01J 4/00* (2006.01)
(52) U.S. Cl. .......................... 356/364; 355/53; 355/55; 355/71; 356/121
(58) Field of Classification Search ......... 356/364–369, 356/399–401, 121; 355/53, 55, 71
See application file for complete search history.

(56) References Cited

U.S. PATENT DOCUMENTS

| 4,540,277 A | 9/1985 | Mayer et al. |
| 5,631,731 A | 5/1997 | Sogard |
| 5,677,755 A | 10/1997 | Oshida et al. |

FOREIGN PATENT DOCUMENTS

| DE | 103 04 822 | 2/2004 |
| EP | 1 091 252 | 4/2001 |
| EP | 1 241 525 | 9/2002 |
| EP | 1 267 212 | 12/2002 |
| JP | 8-22953 A | 1/1996 |
| JP | 2002-198281 | 7/2002 |

OTHER PUBLICATIONS

European Search Report and Written Opinion for App. No. EP 08 00 5173 mailed Aug. 6, 2008, 6 pgs.
European Search Report for App. No. EP 04 25 7919 mailed Mar. 18, 2005, 4 pgs.

*Primary Examiner*—L. G Lauchman
(74) *Attorney, Agent, or Firm*—Sterne, Kessler, Goldstein & Fox P.L.L.C.

(57) ABSTRACT

A method for determining a polarization state of light passed through the projection lens of a lithographic apparatus is described. Polarizing structures are disposed on an object side of the projection lens of the lithographic apparatus. By measuring light that has passed through the polarizing structures information regarding the polarization characteristics of the projection lens can be determined.

12 Claims, 4 Drawing Sheets

LITHOGRAPHIC APPARATUS AND METHODS FOR USE THEREOF

This application claims priority to U.S. Provisional Application No. 60/530,984, filed Dec. 22, 2003.

BACKGROUND OF THE INVENTION

1. Field of the Invention

The present invention relates generally to a lithographic apparatus and more particularly, to a lithographic apparatus using polarization monitoring.

2. Description of the Prior Art

A lithographic apparatus is a machine that applies a desired pattern onto a target portion of a substrate. Lithographic apparatus can be used, for example, in the manufacture of integrated circuits (ICs). In that circumstance, a patterning device, or patterning structure, such as a mask, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

SUMMARY OF THE INVENTION

According to an aspect of the invention, there is provided a method of measuring polarization in a lithographic projection apparatus including, projecting light having a polarization state through a projection lens of the lithographic projection apparatus, passing the projected light through a polarizer, the polarizer including at least a first region having a first polarization characteristic and a second region having a second polarization characteristic different from the first polarization characteristic, and analyzing light that has passed through the polarizer to determine the polarization state.

According to another aspect of the present invention, there is provided a device manufacturing method including projecting light having a polarization state through a projection lens of the lithographic projection apparatus, passing the projected light through a polarizer, the polarizer including at least a first region having a first polarization characteristic and a second region having a second polarization characteristic different from the first polarization characteristic, analyzing light that has passed through the polarizer to determine the polarization state, patterning at least a portion of the projected light according to a desired pattern, and imaging the patterned light onto a radiation sensitive layer on a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. Further, the substrate referred to herein may be processed, before or after exposure, in for example a track (a tool that typically applies a resist to a substrate and develops the exposed resist) or a metrology or inspection tool. Where applicable, the disclosure herein may be applied to such and other substrate processing tools.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm).

The term "patterning device" or "patterning structure" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Embodiment 1

Figure 1:
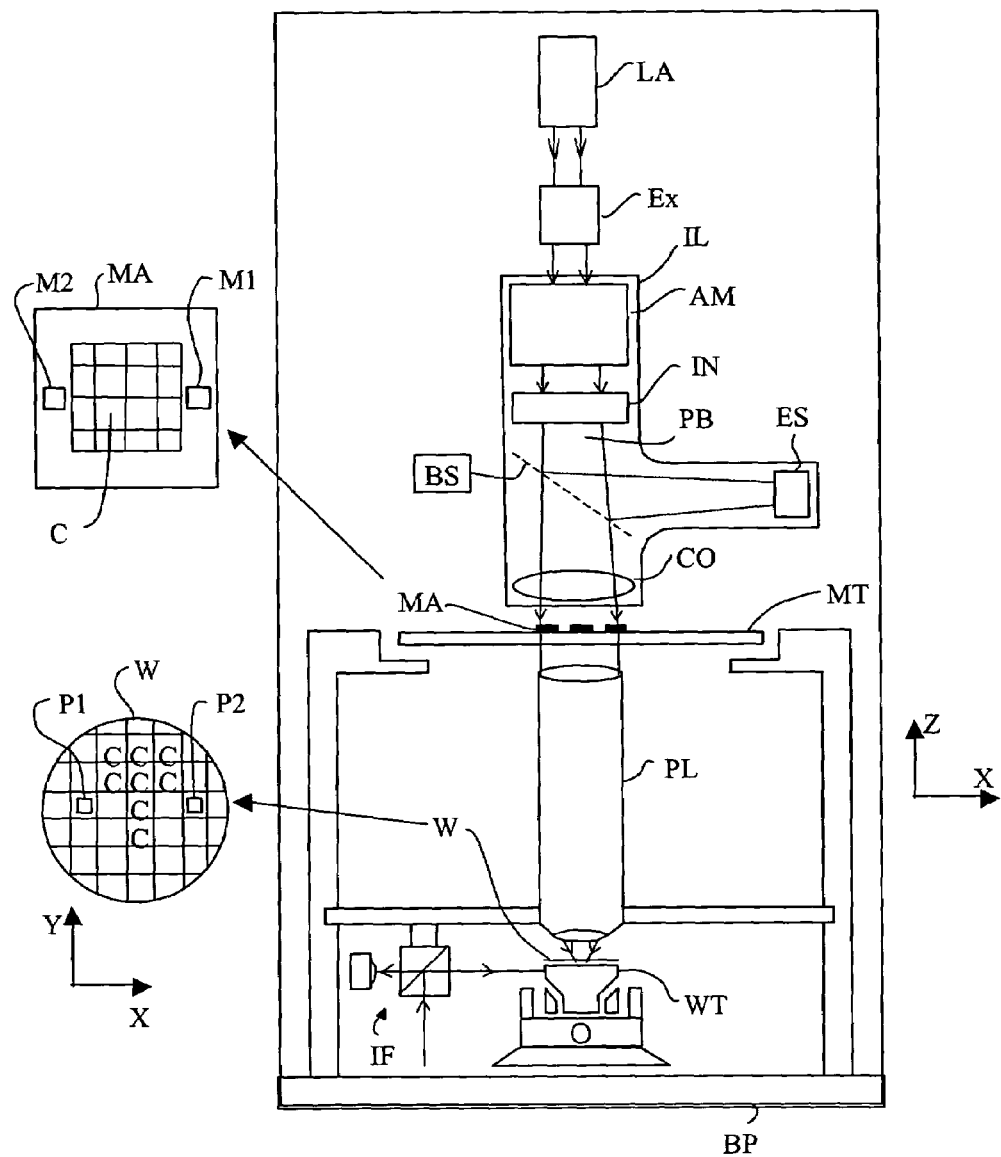
FIG. 1 is a schematic drawing of a lithographic apparatus according to an embodiment of the invention.

FIG. 1 schematically depicts a lithographic projection apparatus 1 according to an embodiment of the present invention. The apparatus includes a base plate BP. The apparatus may also include a radiation source LA (e.g., UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g., a reticle), and is connected to a first positioning device PM that accurately positions the mask with respect to a projection system or lens PL. A second object (substrate) table WT is provided with a substrate holder configured to hold a substrate W (e.g., a resist-coated silicon wafer), and is connected to a second positioning device PW that accurately positions the substrate with respect to the projection system or lens PL. The projection system or lens PL (e.g., a quartz and/or $CaF_2$ lens system or a refractive or catadioptric system, a mirror group or an array of field deflectors) is configured to image an irradiated portion of the mask MA onto a target portion C (e.g., comprising one or more dies) of the substrate W. The projection system PL is supported on a reference frame RF. As here depicted, the apparatus is of a transmissive type (i.e., has a transmissive mask). However, in general, it may also be of a reflective type, (e.g., with a reflective mask). Alternatively, the apparatus may employ another kind of patterning structure, such as a programmable mirror array of a type as referred to above.

The source LA (e.g., a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may include an adjusting device AM configured to set the outer and/or inner radial extent (commonly referred to as σ-outer and σ-inner, respectively) of the intensity distribution in the beam. In addition, it will generally comprise various other components, such as an integrator IN and a condenser CO. In this way, the projection beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors). The latter scenario is often the case when the source SO is an excimer laser. The present invention encompasses both of these scenarios.

In particular, the present invention encompasses embodiments wherein the illuminator IL is configured to supply a projection beam of radiation having a wavelength of less than about 170 nm, such as with wavelengths of 157 nm, 126 nm and 13.6 nm, for example.

The projection beam PB subsequently intercepts the mask MA, which is held on the mask table MT. Having traversed the mask MA, the projection beam PB passes through the projection system PL, which focuses the beam PB onto a target portion C of the substrate W. With the aid of the second positioning device PW and interferometric measuring system IF, the substrate table WT can be moved accurately, e.g., so as to position different target portions C in the path of the beam PB. Similarly, the first positioning device PM can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e., a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

In the illumination system IL, a part of the projection beam PB is diverted to an energy sensor ES by a beam splitter BS. Beam splitter BS may be a reflector formed by depositing aluminum on quartz and used to fold the projection beam to a convenient orientation. A pattern of small holes is etched into the aluminum layer to let a known proportion, e.g., 1%, through to the energy sensor. The output of the energy sensor is used in controlling the dose delivered in an exposure, as described further below.

Particularly in the case where radiation of wavelength 157 nm or below is used, the entire optical path of the apparatus is enclosed in one or more casings CA which can be flushed with a gas, e.g., dry $N_2$, transparent to the radiation used for the projection beam. The flushing, or purge, gas is supplied from gas supply GS which may be a container of clean gas or a plant for scrubbing and drying air.

More particularly in the case where radiation of wavelength 20 nm or below is used, the entire optical path of the apparatus is enclosed in one or more casings CA which can be evacuated using a vacuum pumping system PS.

In lithographic systems such as the system of FIG. 1, it is sometimes the case that the polarization of light has an effect on image quality, and in particular, may reduce critical dimension (CD) uniformity. In general, the polarization state of light at the level of the wafer is unknown, as may be the polarization behavior of the projection lens PL or even the polarization state of the light prior to entering the projection lens PL.

Figure 2:
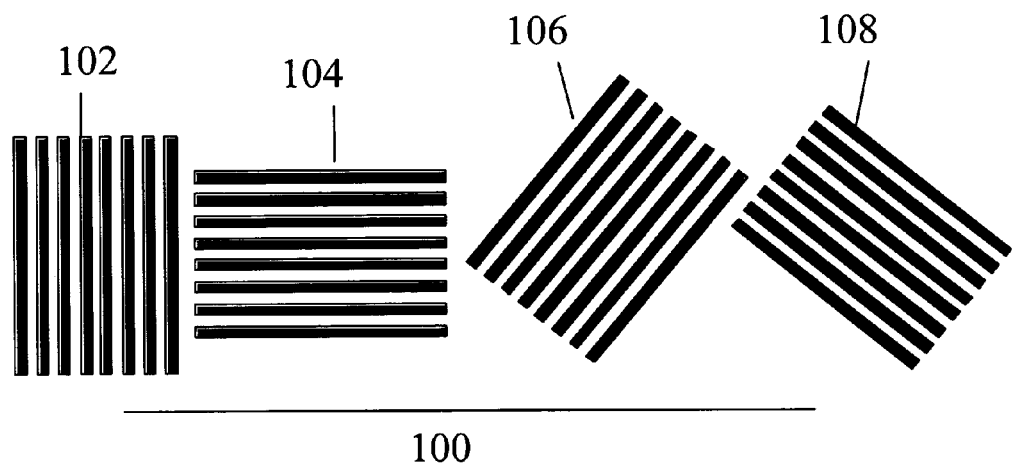
FIG. 2 is a schematic drawing of polarizers in accordance with an embodiment of the present invention.

FIG. 2 illustrates a particular polarizer that may be used as part of a system for measuring polarization in the lithographic apparatus and both measuring and modeling the behavior of the optical components thereof. The polarizer of FIG. 2 contains four polarizing sub-elements, 102, 104, 106 and 108. Each polarizing sub-element includes a grating that has a respective orientation. In general, the polarizer may be located at a reticle plane or on the reticle itself.

In one embodiment, the gratings are made up of lines that are of a size smaller than the resolution of the apparatus under testing. In general, the measured intensity will be related to the linewidth, the chrome pattern thickness and the pitch of the grating. The inventors have determined that linewidths below about 18 nm are quite well suited to use with the present invention as they produce a relatively larger proportion of TE (horizontally) polarized light vs. TM (vertically) polarized light. Furthermore, thicker chrome appears to produce improved ratios for a given linewidth. For example, in one simulated experiment using 10 nm linewidths, 110 nm chrome thickness produced approximately 50% more TE polarized light than did 70 nm thick chrome.

Because the gratings are sub-resolution, they will not be reproduced as images at the wafer level, and may therefore avoid interfering with the integrated circuit or other device to be imaged. In a particular embodiment, the pitch of the gratings may be, for example, about from 50 nm to 100 nm. As will be appreciated, modern lithography apparatus are capable of resolutions on the order of 90 nm, tending to favor the use of gratings having a smaller pitch. Each grating may be, for example, of an area on the order of 30 μm by 30 μm at the wafer level. As will be described further, below, each grating should, in general, be large enough such that light passing through the gratings can be separately measured and identified by an appropriate detector.

As used in relation to embodiments of the present invention, horizontal and vertical polarizations are as viewed in the plane of the mask. So, using the coordinate system of FIG. 1, horizontal polarization is polarization in the X direction and vertical is in the Y direction. As shown in FIG. 2, the first grating 102 has lines having a generally vertical orientation. Because of the sub-resolution lines, this grating will pass only $0^{th}$ order light through to the projection lens PL. Furthermore, the grating pattern will polarize the light in a direction perpendicular to the direction of the grating pattern. Thus, grating 102 will pass only $0^{th}$ order light that is polarized in a horizontal direction. Likewise, grating 104 will pass $0^{th}$ order light polarized in a vertical direction. The two diagonal gratings 106, 108 will pass light polarized at 45° and 135° respectively.

A sensor, not shown, is placed at the wafer level, to detect the polarized light from the polarizers. While in general, the following discussion focuses on intensity (I) of the transmitted light, the transmitted electric field E may alternately be measured.

In one embodiment, the transmission image sensor, already present in the system for monitoring the performance of the tool, may be used as the sensor. A transmission image sensor (TIS) is generally inset into a physical reference surface associated with the substrate table (WT). In a particular embodiment, two sensors are mounted on a fiducial plate mounted to the top surface of the substrate table (WT), at diagonally opposite positions outside the area covered by the wafer W. The fiducial plate is made of a highly stable material with a very low coefficient of thermal expansion, e.g., Invar, and has a flat reflective upper surface that may carry markers used with another fiducial in alignment processes. The TIS is used to determine directly the vertical and horizontal (i.e., X-Y) position of the aerial image, as projected by the projection lens, of a TIS pattern on the mask. It comprises apertures in the reflective surface close behind which is placed a photodetector sensitive to the radiation used for the exposure process. The substrate stage is then scanned horizontally (in one or preferably two directions) and vertically so that the aperture of the TIS passes through the space where the aerial image is expected to be. As the TIS aperture passes through the light and dark portions of the image of the TIS pattern, the output of the photodetector will fluctuate (a Moire effect). The vertical level at which the rate of change of amplitude of the photodetector output is highest indicates the level at which the image of a TIS pattern has the greatest contrast and hence indicates the plane of optimum focus. The horizontal level at which the rate of change is highest indicates the aerial image's lateral position. An example of a TIS of this type is described in greater detail in U.S. Pat. No. 4,540,277. Alternately to using a TIS, a wafer having a radiation sensitive resist can be exposed. By measuring the intensity of the light that has passed, at the reticle plane, through each grating 102, 104, 106, 108, information about the original polarization state of the light can be determined.

Because the gratings have different polarization characteristics (for example, the pair 102, 104 pass orthogonal polarizations) each one provides a different piece of information about the polarization state of the light. For example, a comparison of the intensities of the light passing through the vertical polarizer 102 and the horizontal polarizer 104 can give an indication of the relative behavior of the lens in response to horizontally and vertically polarized light. It should also be noted that all four gratings are not required for the practice of the present invention. In general, all that is needed is a pair of mutually orthogonal gratings, for example, 102 and 104, or 106 and 108. However, the full set may provide additional information not available from any one pair.

Figure 3:
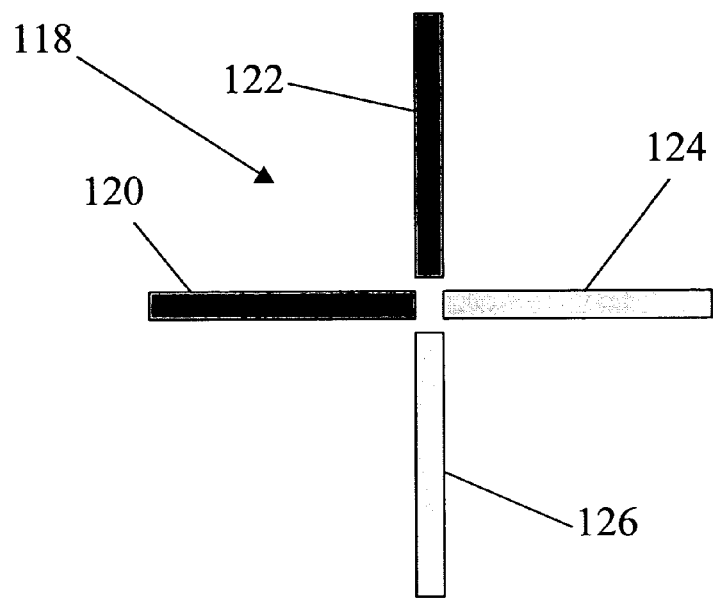
FIG. 3 is a schematic drawing of a polarizing structure in accordance with an embodiment of the present invention.

In an alternate embodiment of the present invention as shown in FIG. 3, two pairs of structures can be used to provide absolute information on the polarization state of the light at the wafer level. A polarization structure shown generally at 118 includes a pair of polarization sensitive structures, 120 and 122 and a pair of polarization insensitive structures 124, 126. The image of a polarization sensitive structure depends on the polarization state of the illumination radiation, while imaging of a polarization insensitive structure will be consistent even when the polarization state of the illumination radiation is varied. In practice, structures are relatively sensitive or insensitive rather than entirely one or the other.

In the structure 118, each pair of structures includes structures having different polarization characteristics and each pair has different polarization characteristics from the other pair. Specifically, structure 120 is sensitive to horizontal polarization while structure 122 is sensitive to vertical polarization. Likewise, structure 124 is generally insensitive to horizontal polarization and structure 126 is generally insensitive to vertical polarization. Because structures 124 and 126 are each polarization insensitive, they should behave generally similarly to each other and can each be used independently as a reference, or can be used separately as a reference for their respective paired sensitive structure. Because imaging in a lithographic apparatus may have feature direction dependent variations, for example with dipole illumination, horizontal and vertical lines may image differently, it may be best to keep the horizontal reference 124 associated with the horizontal sensitive structure 120 and similarly the vertical reference 126 and vertical sensitive structure 122.

Figure 6:
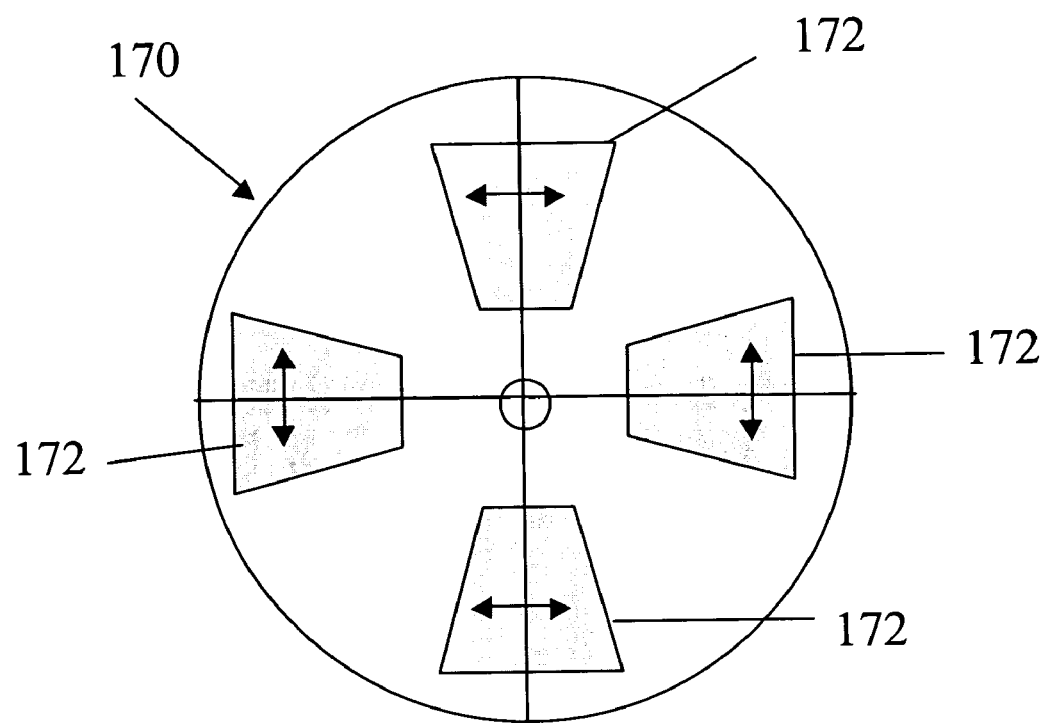
FIG. 6 is a schematic drawing of a quadrupole illumination mode having tangential polarization.

In order to determine a polarization vector ($\alpha$, $\beta$), representing the polarization state of the light, four intensities are measured, one for each structure of the polarizer 118. Setting $\alpha=(Pv-Rv)$, where Pv is the intensity measured of light that has passed through the vertical polarization sensitive structure 122 and Rv is the intensity measured of light that has passed through the vertical polarization insensitive structure 126, and $\beta=(Ph-Rh)$, where Ph is the intensity measured of light that has passed through the horizontal polarization sensitive structure 120 and Rh is the intensity measured of light that has passed through the horizontal polarization insensitive structure 124, gives the polarization vector ($\alpha$, $\beta$). In the case where $\alpha=\beta$, the light is one of unpolarized, circularly polarized or tangentially polarized. By tangentially polarized is meant, for example, light that is polarized in a direction perpendicular to axes of the pupil plane in an off-axis illumination mode. To illustrate this, FIG. 6 shows an example of a quadrupole illumination mode 170 in which four poles 172 are arrayed along the X and Y axes. Within each pole, a polarization direction is indicated by the arrows. In a cross-quadrupole mode (rotated 45 degrees from that shown in FIG. 6) having tangential polarization, the polarization arrows would be perpendicular to a set of axes rotated along with the poles.

Further, the length of the vector can provide additional information. Specifically, for unpolarized and 45 degree rotated tangential polarization, the vector has a length L while properly tangentially polarized light will produce a vector of length 0. Because the difference measurements (Pv-Rv), (Ph-Rh) are relative rather than absolute measurements, they lack complete information regarding the absolute magnitude of the vector. Thus, when the polarization dependent response of features is known, or can be simulated, the vector ($\alpha$, $\beta$) can provide the specific magnitude and direction of the polarization vector.

Figure 4:
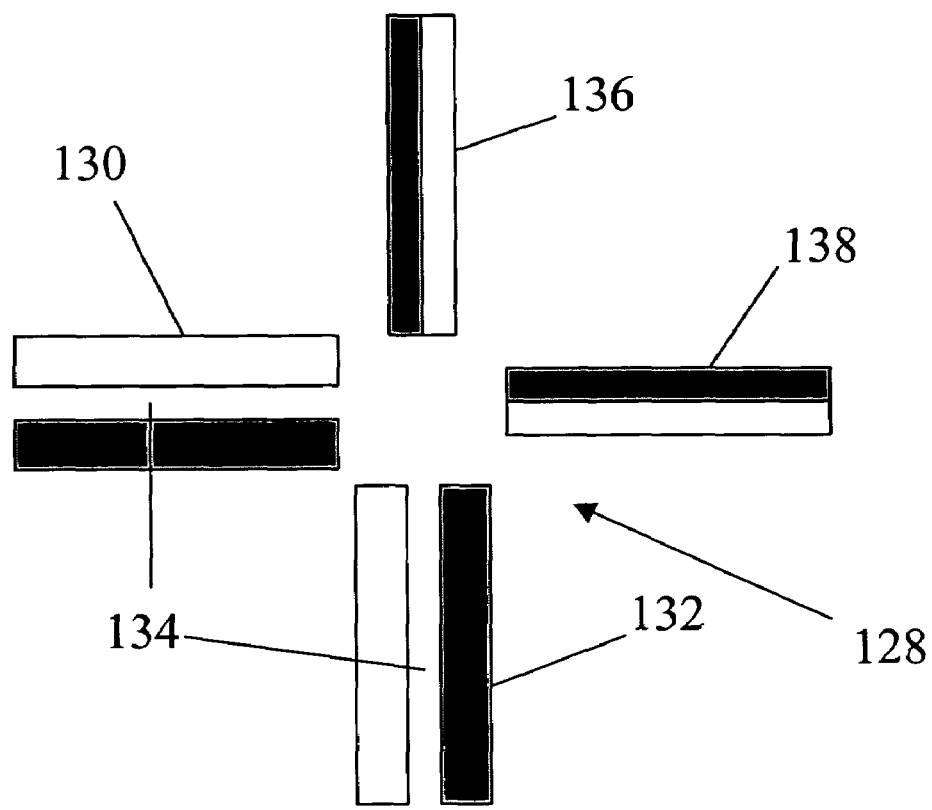
FIG. 4 is a schematic drawing of a particular embodiment of the structure of FIG. 3.

FIG. 4 shows a particular embodiment of a structure 128 that can be used as the polarizer 118 of FIG. 3, however it is rotated relative to the FIG. 3 structure. Structures 130, 132, 136 and 138 may be, for example, a phase shift pair in which the white areas contain no phase shift and the darker areas contain a 180 degree or $\pi$ phase shift. The structures 130, 132 are relatively insensitive to polarization due to the large phase edges 134. In contrast, structures 136 and 138 are relatively sensitive to vertical and horizontal polarizations respectively. The operation of this structure is as shown and described with respect to FIG. 3. Though FIG. 4 is shown as a light field for ease of illustration, a similar structure can be provided for a dark field reticle.

When using the structures shown in FIG. 4 it may be beneficial to make use of two different procedures, depending on the type of illumination used. For on-axis illumination, it is possible to measure both the horizontal and the vertical structures in a single exposure operation. In contrast, when using off-axis illumination, the measurement may be facilitated by separating the horizontal and vertical measurements. Specifically, by blocking the vertical structures, for example using a dipole blade, the horizontal structures may be scanned alone. Next, by blocking the horizontal structures, the vertical structures may be scanned alone. Alternately, the structures themselves could be physically separated such that only the horizontal structures are present at one point in the scan while only the vertical structures are present at another, time-separated point. To achieve a more complete separation, entirely separate reticles could be used.

Figure 5:
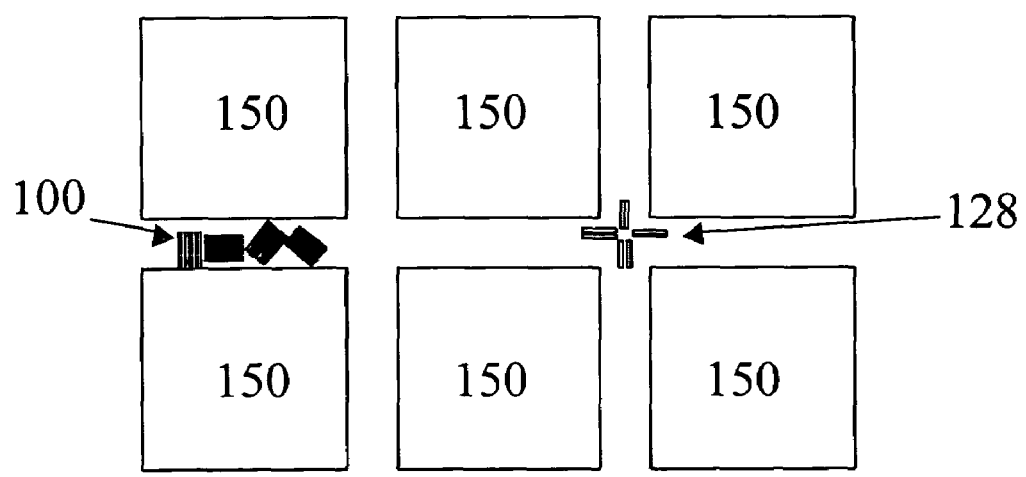
FIG. 5 is a schematic drawing of a portion of a reticle incorporating polarizing structures in accordance with embodiments of the invention.

FIG. 5 shows an example of a pattern of a reticle incorporating polarization structures in accordance with the present invention. Specifically, a number of chips or other devices 150 are arrayed in a pattern with scribe lines disposed between them. A pattern 100 and a pattern 128 as shown in FIGS. 3 and 4 respectively are disposed in the scribe lines. It should be appreciated that in general, only one of the two types of patterns would be used at any one time, but both are shown for the purpose of illustration only. In alternate embodiment, the polarization measuring structures may be disposed on a reticle separate from any chip pattern or on a test pattern reticle so that measurements may be made without imaging any other devices.

While specific embodiments of the invention have been described above, it will be appreciated that the invention may be practiced otherwise than as described. The description is not intended to limit the invention.

The invention claimed is:

1. A method of measuring polarization in a lithographic projection apparatus, comprising:
    projecting light having a polarization state through a projection lens of the lithographic projection apparatus;
    passing the projected light through a polarization sensitive structure, the polarization sensitive structure including at least a first region having a first polarization characteristic and a second region having a second polarization characteristic different from the first polarization characteristic; and
    analyzing light that has passed through the polarization sensitive structure to determine the polarization state based on the projected light passing through the first region having the first polarization characteristic and the second region having the second polarization characteristic.

2. A method as in claim 1 wherein the polarization sensitive structure is located at an object side pupil plane of the projection lens or a Fourier transform plane thereof.

3. A method as in claim 1 wherein the first region and the second region comprise a pair of mutually orthogonal polarizers.

4. A method as in claim 1 wherein analyzing the light comprises measuring an intensity of the light.

5. A method as in claim 4 wherein analyzing the light comprises detecting light from the first region and light from the second region.

6. A method as in claim 1 wherein analyzing the light comprises measuring an intensity of the light from the first region and an intensity of the detected light in the second region and using the two measured intensities to determine the polarization state.

7. A method as in claim 6 wherein the two measured intensities form elements of a polarization vector defining the polarization state.

8. A method as in claim 1, wherein the first region and the second region comprise structures that are relatively polarization sensitive and relatively polarization insensitive respectively.

9. A method as in claim 8 wherein the relatively polarization sensitive and relatively insensitive structures each comprise at least two substructures having respective mutually perpendicular components.

10. A method of manufacturing a device comprising:
projecting light having a polarization state through a projection lens of the lithographic projection apparatus;
passing the projected light through a polarization sensitive structure, the polarization sensitive structure including at least a first region having a first polarization characteristic and a second region having a second polarization characteristic different from the first polarization characteristic;
analyzing light that has passed through the polarizer to determine the polarization state;
patterning at least a portion of the projected light according to a desired pattern;
and imaging the patterned light onto a radiation sensitive layer on a substrate.

11. A lithographic apparatus comprising:
a radiation system to provide a projection beam of radiation and having a polarization state;
a support structure to support patterning structure, the patterning structure constructed and arranged to pattern the projection beam according to a desired pattern;
a substrate table to hold a substrate;
a projection system to project the patterned beam onto a target portion of the substrate; and
a detector constructed and arranged to detect light that has passed through a polarization sensitive structure disposed on an object side of the projection system including at least a first region having a first polarization characteristic and a second region having a second polarization characteristic different from the first polarization characteristic; to determine the polarization state.

12. An apparatus as in claim 11 wherein the polarization sensitive structure is located on the patterning structure.

* * * * *